United States Patent [19]

Miller

[11] Patent Number: 5,966,033
[45] Date of Patent: Oct. 12, 1999

[54] LOW RIPPLE PHASE DETECTOR

[75] Inventor: Charles A. Miller, Fremont, Calif.

[73] Assignee: Credence Systems Corporation, Fremont, Calif.

[21] Appl. No.: 09/014,335

[22] Filed: Jan. 27, 1998

[51] Int. Cl.⁶ .......................... H03D 13/00; G01R 29/00
[52] U.S. Cl. ..................... 327/3; 327/7; 327/12
[58] Field of Search ............... 327/3, 7, 12; 326/56, 326/52

[56] References Cited

U.S. PATENT DOCUMENTS

| | | | |
|---|---|---|---|
| 3,600,692 | 8/1971 | McGee | 328/134 |
| 4,020,422 | 4/1977 | Underhill | 328/133 |
| 4,237,423 | 12/1980 | Rhodes | 328/133 |
| 4,291,274 | 9/1981 | Suzuki et al. | 328/133 |
| 4,520,319 | 5/1985 | Baker | 328/133 |
| 4,684,830 | 8/1987 | Tsui | 327/12 |
| 4,751,469 | 6/1988 | Nakagawa et al. | 328/133 |
| 4,970,475 | 11/1990 | Gillig | 331/25 |
| 5,059,833 | 10/1991 | Fujii | 307/510 |
| 5,376,847 | 12/1994 | Staszewski | 327/12 |
| 5,432,480 | 7/1995 | Popescu | 331/11 |
| 5,550,878 | 8/1996 | Shigaki | 375/373 |

FOREIGN PATENT DOCUMENTS

| | | | |
|---|---|---|---|
| 60-58716 | 4/1985 | Japan | 327/12 |
| 4-48824 | 2/1992 | Japan | 327/12 |

*Primary Examiner*—Timothy P. Callahan
*Assistant Examiner*—An T. Luu
*Attorney, Agent, or Firm*—Smith-Hill and Bedell

[57] ABSTRACT

A phase detector produces a pulsed tri-state output signal representing a phase difference between first and second input signals. The pulse width of the output signal indicates the magnitude of the phase difference while the sign of the output signal pulses indicates whether the first input signal leads or lags the second input signal. The first and second input signals drive D and clock inputs, respectively, of a type D flip-flop, and also drive separate inputs of an XOR gate. An output of the flip-flop provides a signal input to a tristate buffer while an output of the XOR gate drives a tri-state control input of the tristate buffer. The tristate buffer produces the phase detector output signal.

4 Claims, 1 Drawing Sheet

LOW RIPPLE PHASE DETECTOR

BACKGROUND OF THE INVENTION

1. Field of the Invention

The present invention relates in general to phase detectors and in particular to a phase detector providing output pulses of width proportional to a phase difference between two input signals.

2. Description of Related Art

A phase detector compares two input signals and generates an output signal indicative of their phase difference. Phase detectors are commonly used in phase-locked loop (PLL) circuits as illustrated in FIG. 1. The PLL circuit of FIG. 1 produces an output signal (OUTPUT) having a magnitude proportional to the frequency of an input signal INPUT. A phase detector 10 produces a signal LEAD/LAG indicating whether the INPUT signal leads or lags a signal VCO produced by a voltage-controlled oscillator 12 controlled by the OUTPUT signal. The LEAD/LAG signal tells a charge pump 14 whether to add or remove charge from a capacitor within a low pass filter 16, thereby raising or lowering the voltage of the PLL output signal OUTPUT. The OUTPUT signal controls the frequency of oscillation of the VCO signal. When VCO lags the INPUT signal, phase detector 10 drives LEAD/LAG high telling charge pump 14 to add charge to the capacitor in filter 16. This increases the OUTPUT voltage, thereby increasing the frequency of oscillation of the VCO signal. Conversely, when VCO leads the INPUT signal, phase detector 10 drives LEAD/LAG low telling charge pump 14 to remove charge from the capacitor in filter 16. This decreases the OUTPUT voltage, thereby decreasing the frequency of oscillation of the VCO signal. The OUTPUT signal magnitude stabilizes at a level that frequency locks the VCO signal to the INPUT signal, and is thereby indicative of the frequency of the INPUT signal.

A prior art "type I" phase detector, such as a simple exclusive or (XOR) gate, produces an output LEAD/LAG signal that is always either high or low. Thus charge pump 14 must always be either adding charge to or removing charge from filter 16, even when INPUT and VCO are in phase. Thus the OUTPUT signal tends to jitter. The amount of jitter in the OUTPUT signal can be reduced by increasing the size of the capacitor in filter 16, but a large capacitor can add expense and bulk to the PLL circuit.

U.S. Pat. No. 4,291,274 issued Sep. 22, 1981 to Suzuki et al illustrates a prior art "type II" phase detector. A type II phase detector produces a tri-state output LEAD/LAG signal that tri-states when its two input signals are in phase with one another. The type two phase detector otherwise produces a sequence of pulses in its output LEAD/LAG signal with the sign of the pulses indicating which of its two input signals leads the other and with the width of the pulses indicating the amount of phase difference between the two signals. When phase detector 10 of FIG. 1 is implemented by a type II phase detector, the LEAD/LAG signal spends progressively more of its time in tri-state condition as the frequency of the VCO signal approaches that of the INPUT signal. Thus charge pump 14 spends progressively less of its time pumping charge into or out of filter 16. This greatly reduces jitter in the OUTPUT signal.

While the type II phase detector of the aforementioned patent reduces jitter in the VCO signal, it is substantially more complex than a type I phase detector employing only a single XOR gate. What is needed is a circuit that provides the benefits of a type II phase detector while employing fewer components.

SUMMARY OF THE INVENTION

A phase detector in accordance with the present invention produces a pulsed tri-state output signal representing a phase difference between first and second input signals. The output signal pulse width indicates the magnitude of the phase difference while the sign of the output signal pulses indicates whether the first input signal leads or lags the second input signal. The first and second input signals drive D and clock inputs, respectively, of a type D flip-flop, and also drive separate inputs of an XOR gate. An output of the flip-flop provides a signal input to a tristate buffer while an output of the XOR gate drives a tri-state control input of the tri-state buffer. The tri-state buffer produces the phase detector output signal.

It is accordingly an object of the invention to provide a phase detector that produces an output signal representing a phase difference between two input signals and which requires relatively fewer parts than prior art phase detectors producing similar results.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

DESCRIPTION OF THE PREFERRED EMBODIMENT(S)

Figure 1:
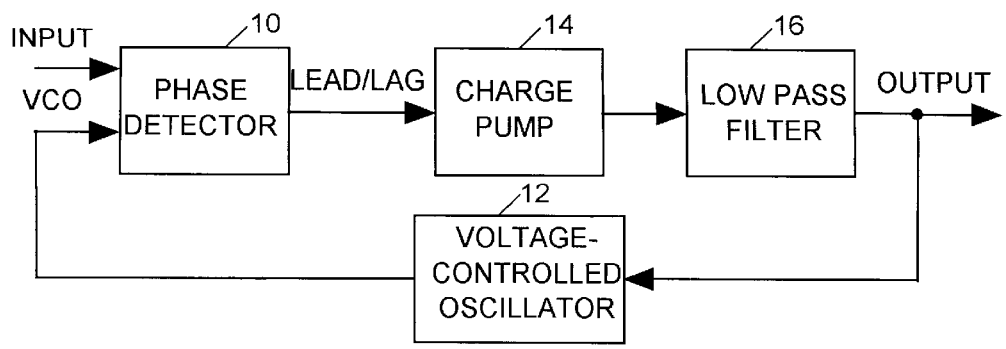
FIG. 1 illustrates a prior art phase lock loop circuit employing a phase detector.
Figure 2:
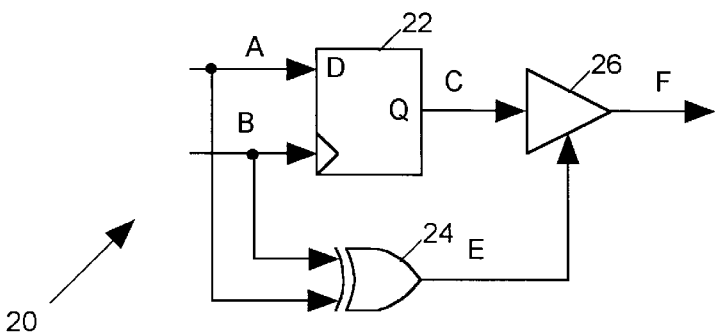
FIG. 2 illustrates a phase detector in accordance with the present invention.

FIG. 2 illustrates a phase detector 20 in accordance with the present invention for producing a pulsed tri-state output signal F representing a phase difference between first and second input signals A and B. The pulse width of output signal F indicates the magnitude of the phase difference between input signals A and B while the sign of pulses of output signal F indicates whether the first input signal A leads or lags the second input signal B. Phase detector 20 includes a type D flip-flop 22, an XOR gate 24 and a tri-state buffer 26. The first and second input signals A and B drive the D and clock inputs, respectively, of flip-flop 22, and also drive separate inputs of XOR gate 24. The Q output of flip-flop 22 provides an input signal C to tri-state buffer 26 while an output signal E of the XOR gate 24 drives a tri-state control input of tri-state buffer 26.

Flip-flop 22 drives its output signal C high when input signal A is high on the leading edge of a pulse of input signal B and drives its output signal C low when input signal A is low on the leading edge of a pulse of input signal B. XOR gate 24 asserts its output signal E when only one of its input signals is asserted and otherwise deasserts its output signal E. Tri-state buffer 26, when enabled by an asserted XOR output signal E, amplifies the flip-flop 22 output signal C to produce phase detector output signal F. Thus when buffer 26 is enabled the state of its output signal F matches the state of its input signal C. When the XOR output signal E is low, buffer 26 is not enabled neither pulls its output signal F neither up nor down.

Figure 3:
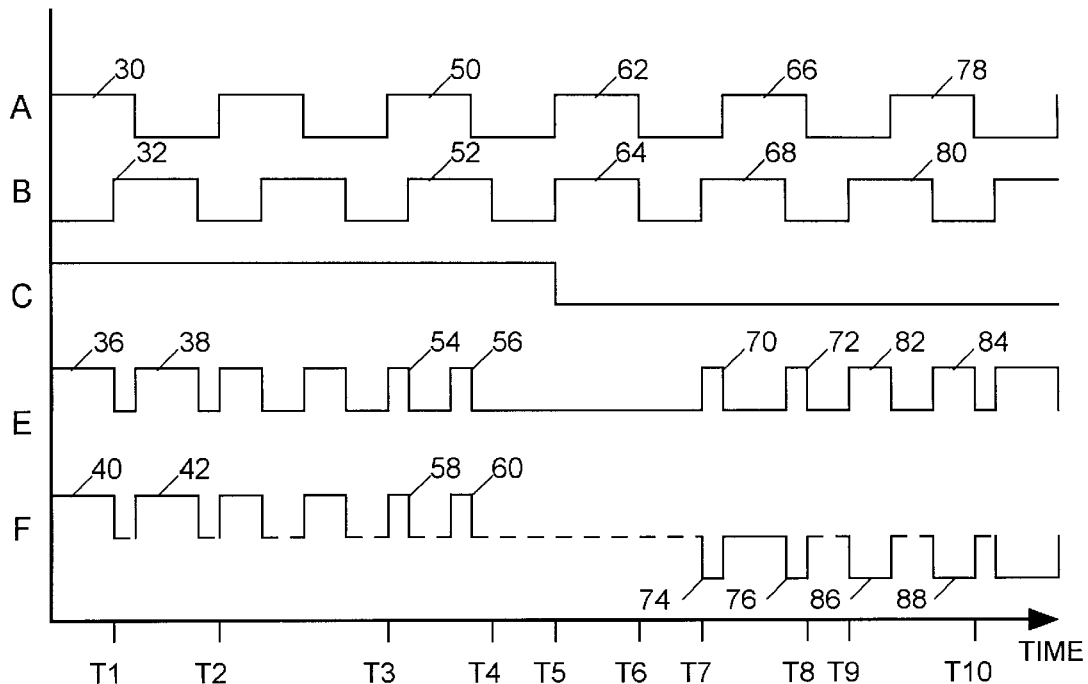
FIG. 3 is a timing diagram illustrating operation of the phase detector of FIG. 2.

FIG. 3 is a timing diagram illustrating operation of phase detector 20 of FIG. 2 in an example where input signal A has a lower frequency than input signal B. Initially between times T1 and T2 signal A leads signal B in that each pulse 30 of signal A is high when a leading edge 32 of a pulse of signal B arrives at the clock input of flip-flop 22. Thus flip-flop 22 output signal C is high. Since pulses 30 and 32 of input signals A and B are substantially out of phase, the output signal E of XOR gate 24 includes relatively wide pulses 36 and 38. Since C is high between times T1 and T2, tri-state buffer 26 is enabled and the phase detector output signal F includes two relatively wide, positive-going pulses 40 and 42.

Later, between times T3 and T4, when input signal B still lags input signal A but only by a small amount, flip-flop 22 output signal C is still high and XOR gate 24 output signal E still includes two pulses 54 and 56 which produce two corresponding pulses 58 and 60 in tri-state buffer 26 output signal F. However pulses 54–58 and 60 are much narrower than pulses 40 and 42 since pulses 50 and 52 are more nearly in phase than pulses 30 and 32.

Between times T5 and T6, pulses 62 and 64 of signals A and B are substantially in phase with one another and flip-flop output signal C is low. Since the XOR gate output signal E includes no pulses, buffer 26 remains tri-stated between times T5 and T6.

Between times T7 and T8, pulse 66 of input signal A lags pulse 68 of input signal B by a small amount, flip-flop 22 output signal C is low and XOR gate 24 produces two narrow pulses 70 and 72 in its output signal E that briefly enable tri-state buffer 26 twice. Since the input signal C to buffer 26 is low, buffer 26 produces two narrow negative-going output pulses 74 and 76 between times T7 and T8. The sign and pulse-width of pulses 74 and 76 reflect the fact that pulse 68 leads pulse 66, but not by much.

Between times T9 and T10, pulse 78 of input signal A lags pulse 80 of input signal B by a greater amount of time than pulse 66 lags pulse 68. Thus XOR gate 24 produces two wider pulses 82 and 84 in its output signal E. Since the input signal C to buffer 26 is still low, buffer 26 produces two wider negative-going output pulses 86 and 88 between times T9 and T10.

Thus the output signal F is a tri-state signal that includes positive-going pulses when input signal A leads input signal B, negative-going pulses when input signal B leads input signal A, and no pulses when input signals A and B are in phase with one another. Also the pulse width of output signal F is proportional to the phase difference between the input A and B signals.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A phase detector for receiving first and second input signals and for producing a phase detector output signal in which a width of each pulse thereof represents an amount of phase shift between said first and second input signals and wherein a sign of each pulse thereof indicates whether said first input signal leads said second input signal, the phase detector comprising:

logic means for receiving said first input signal and said second input signal and for producing an indicating signal having a sign indicting whether said first input signal leads said second input signal;

an XOR gate receiving said first input signal and said second input signal and producing an XOR gate output signal indicating when only one of said first input signal and said second input signal is asserted; and a tristate buffer enabled by said XOR gate output signal and amplifying said indicating signal when enabled, thereby to produce said phase detector output signal.

2. The apparatus in accordance with claim 1 wherein said logic means comprises a flip-flop.

3. The apparatus in accordance with claim 1 wherein said logic means consists of a flip-flop.

4. The apparatus in accordance with claim 3 wherein said flip-flop is a type D flip-flop having a D input receiving said first input signal and a clock input receiving said second output signal.

* * * * *